(12) United States Patent
Liao et al.

(10) Patent No.: US 7,018,859 B2
(45) Date of Patent: Mar. 28, 2006

(54) METHOD OF FABRICATING ALGAINP LIGHT-EMITTING DIODE AND STRUCTURE THEREOF

(75) Inventors: Tien-Fu Liao, Taipei Hsien (TW); Chih-Sung Chang, Hsinchu (TW); Tzer-Perng Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 10/917,950

(22) Filed: Aug. 13, 2004

(65) Prior Publication Data
US 2005/0287687 A1 Dec. 29, 2005

(30) Foreign Application Priority Data
Jun. 28, 2004 (TW) .............................. 93118819 A

(51) Int. Cl.
*H01L 21/00* (2006.01)

(52) U.S. Cl. .......................................... 438/22; 257/79

(58) Field of Classification Search ............ 438/22–47, 438/69, 956; 257/79
See application file for complete search history.

(56) References Cited

U.S. PATENT DOCUMENTS
6,876,005 B1 * 4/2005 Hsieh et al. .................. 257/84
* cited by examiner

*Primary Examiner*—David Nelms
*Assistant Examiner*—Quoc Hoang
(74) *Attorney, Agent, or Firm*—Michael A. Glenn; Glenn Patent Group

(57) ABSTRACT

A soft transparent adhesive layer is utilized to bond a transparent substrate material onto an AlGaInP light-emitting diode epitaxy on a GaAs substrate, and the GaAs substrate is next removed entirely. Then, a mesa etching process is performed to form a first top surface and a second top surface on the AlGaInP light-emitting diode epitaxy for respectively exposing an n-type layer and a p-type layer in the AlGaInP light-emitting diode epitaxy. Next, a metal reflective layer and a barrier layer are formed on the AlGaInP light-emitting diode epitaxy in turn, and electrodes are finally fabricated on the barrier layer.

13 Claims, 3 Drawing Sheets

METHOD OF FABRICATING ALGAINP LIGHT-EMITTING DIODE AND STRUCTURE THEREOF

FIELD OF THE INVENTION

The present invention relates to a method of fabricating an AlGaInP light-emitting diode and a structure thereof, and more particularly, to a method of fabricating an AlGaInP light-emitting diode with high light output intensity.

BACKGROUND OF THE INVENTION

Because of the low cost, simple structure, low power consumption and small size thereof, the light emitting diode (LED) is applied in display and illumination technologies. AlGaInP LED devices have already attracted considerable attention in red, yellow, orange, and green LED development.

For general AlGaInP LED fabrication, an AlGaInP LED device is formed on a GaAs substrate directly, while a cathode electrode and an anode electrode are respectively fabricated on different sides of the substrate. This conventional structure has a better current spreading efficiency, but an increased device package area is necessary. Therefore, a flip chip AlGaInP LED device has been gradually developed over the last few years.

The p-type semiconductor layer and the n-type semiconductor layer are exposed on the same side of the LED structure in a flip chip AlGaInP LED fabrication to allow the anode electrode and the cathode electrode to be on the same side of the LED, and the LED structure with electrodes can thus be reversed onto a solder directly by flip chip packaging technology. Thus, conventional wire bonding for the package is not necessary, and a smaller package size and higher device reliability are obtained.

However, the light emitted upward from the flip chip AlGaInP LED is absorbed by the GaAs substrate and cannot pass through the GaAs for complete outward output. Therefore, although the flip chip AlGaInP LED is beneficial for device package, the flip chip AlGaInP LED suffers a lowered LED light output intensity.

Further, the field of LED technology is highly focused on the development of LED devices with higher brightness. Unfortunately, only the light emitted upward from the LED counts as light output; the light emitted downward is partially absorbed by the material below the LED device and is not another source for light output. More particularly, the light emitted downward from the flip chip LED is easily blocked and scattered by electrodes. Thus, the light output of the LED only depends on the diode luminance, and the light output intensity is limited in improvement.

SUMMARY OF THE INVENTION

An objective of the present invention is to provide a method of fabricating an AlGaInP LED and structure therefore. The superiority of the flip chip LED structure is preserved, and the light output intensity of LED devices is further enhanced. The product quality and brightness of AlGaInP LED devices are thereby greatly improved.

According to the aforementioned objectives of the present invention, a method of fabricating an AlGaInP LED and a structure therefore is provided. At least an AlGaInP LED epitaxy is first formed on a substrate, and a transparent substrate material is next bonded to the AlGaInP LED epitaxy by utilizing a soft transparent adhesive layer. The AlGaInP LED epitaxy is a film stack comprising a first-type semiconductor layer, an active layer, and a second-type semiconductor layer. Then, the substrate is removed entirely to enable the AlGaInP LED epitaxy to be transferred to the transparent substrate material.

The substrate aforementioned is GaAs generally for obtaining a good crystallization quality of the AlGaInP epitaxy films, and the transparent substrate material may be sapphire, glass, GaP, or SiC.

Next, a mesa-etching process is performed for the AlGaInP LED epitaxy supported on the transparent substrate material to remove a portion of the AlGaInP LED epitaxy, and the AlGaInP LED epitaxy thus has a first top surface and a second top surface. The distance from the first top surface to the transparent substrate material is greater than that from the second top surface to the transparent substrate material. The first top surface and the second top surface have first-type electricity and second-type electricity, respectively.

After performing the mesa-etching process, a metal reflective layer is formed on the first top surface of the AlGaInP LED epitaxy and also on portions of the second top surface. The metal reflective layer is made from a material with a high reflectivity such as, for example, gold (Au), aluminum (Al), silver (Ag), or Ag alloy.

Finally, a first electrode and a second electrode are fabricated on the metal reflective layer, in which the first electrode is above the first top surface of the AlGaInP LED epitaxy, and the second electrode is above the second top surface of the AlGaInP LED epitaxy.

Additionally, a barrier layer is further placed between the metal reflective layer and the electrodes to prevent the electrodes from metal diffusing into the metal reflective layer and preserve the reflectivity of the metal reflective layer. The preferable material of the barrier layer is nickel (Ni), tungsten (W), titanium nitride (TiN), platinum (Pt), tungsten nitride (WN), zinc oxide (ZnO), or indium tin oxide (ITO).

Furthermore, the surface of the AlGaInP LED epitaxy is roughened to form a rough surface before bonding the transparent substrate material for reducing the total reflection phenomenon inside the LED device, and the light extraction efficiency of the LED device is improved. Even the transparent substrate material is roughened to reduce the total reflection for further improving the light output intensity of the LED device.

With the application of the present invention, the AlGaInP LED is finally supported by the transparent substrate material so that the light emitted from the AlGaInP LED is able to pass through the transparent substrate material and be successfully output outwards. Thus, the superiority of the flip chip LED structure is obtained for promoting the device reliability, and the light output intensity of the flip chip AlGaInP LED device is enhanced.

Further, the present invention utilizes the metal reflective layer placed between the AlGaInP LED epitaxy and the electrodes to reflect the light emitted downward from the LED structure, and the light emitted downward is thus reflected back into the LED and changed into a source of the light output upward. Therefore, the present invention makes use of the light emitted from the AlGaInP LED effectively for improving the light output intensity greatly, and the device brightness is increased.

Moreover, the surface of the AlGaInP LED structure or that of the transparent substrate material is further roughened in the present invention to increase the light extraction efficiency of the AlGaInP LED device and improve the light output intensity of the AlGaInP LED device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The general substrate of the AlGaInP flip chip LED is changed into a transparent substrate material; further, a metal reflective layer and a barrier layer are placed between the electrodes and the LED structure. Additionally, the interface of the LED structure and the transparent substrate material is roughened to further improve the light output intensity of the AlGaInP LED.

Embodiment

The present invention discloses a method of fabricating an AlGaInP LED and a structure therefore. FIGS. 1A–1D are cross-sectional, schematic diagrams showing the process for forming the AlGaInP LED in accordance with the preferred embodiment of the present invention.

Figure 1A:
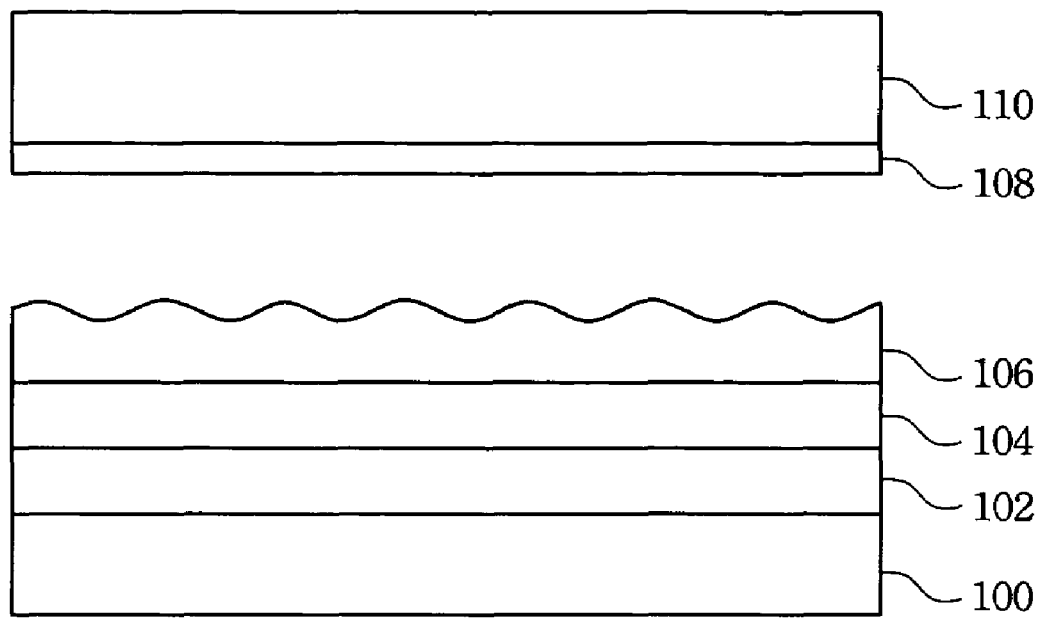
FIGS. 1A–1D are cross-sectional, schematic diagrams showing the process for forming the AlGaInP LED in accordance with the preferred embodiment of the present invention.

In FIG. 1A, an AlGaInP LED epitaxy structure is first formed on a substrate 100, in which the substrate 100 is, for example, GaAs for obtaining a good crystallization quality of the AlGaInP epitaxy layers. The AlGaInP LED epitaxy structure is fabricated by forming an n-type AlGaInP layer 102, an AlGaInP active layer 104, and a p-type AlGaInP layer 106 in turn on the substrate 100. Further, the surface of the p-type AlGaInP layer 106 is next roughened to form a rough surface; for example, a photolithography and etching process is utilized to micro-etch the surface of the p-type AlGaInP layer 106 for producing surface roughness of the p-type AlGaInP layer 106.

The active layer 104 may be a homo-structure, single hetero-structure, double hetero-structure, or multi-quantum well structure. The rough surface of the p-type AlGaInP layer 106 is composed of bar-shaped, triangular, or round salient figures.

Figure 1B:
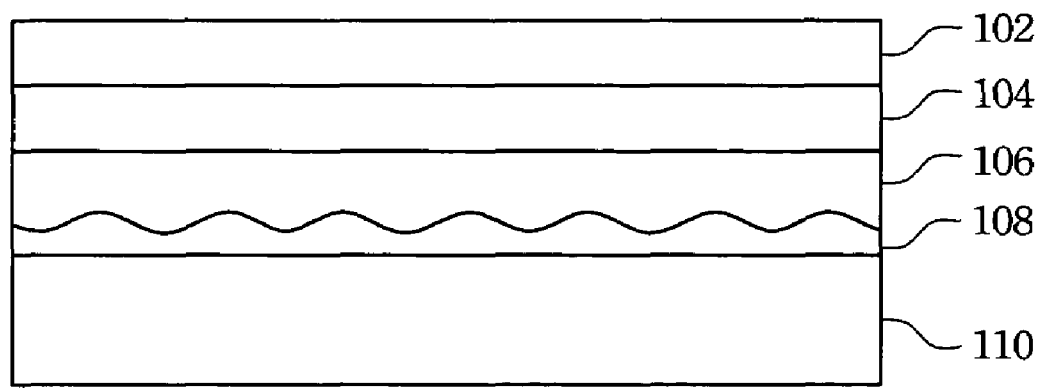

Then, a transparent substrate material 110 having a surface coated with a soft transparent adhesive layer 108 is bonded to the AlGaInP LED epitaxy, in which the transparent substrate material 110 is pasted down on the p-type AlGaInP layer 106 by the adhesion property of the soft transparent adhesive layer 108. After combing the transparent substrate material 110 and the AlGaInP LED epitaxy structure, the substrate 100 is removed to form the structure as shown in FIG. 1B, and the AlGaInP LED epitaxy is completely transferred from the substrate 100 to the transparent substrate material 110.

The transparent substrate material 110 may be sapphire, glass, GaP, or SiC; the soft transparent adhesive layer 108 may be bisbenzocyclobutene (BCB) resin for closely connecting the transparent substrate material 110 and the p-type AlGaInP layer 106.

Figure 1C:
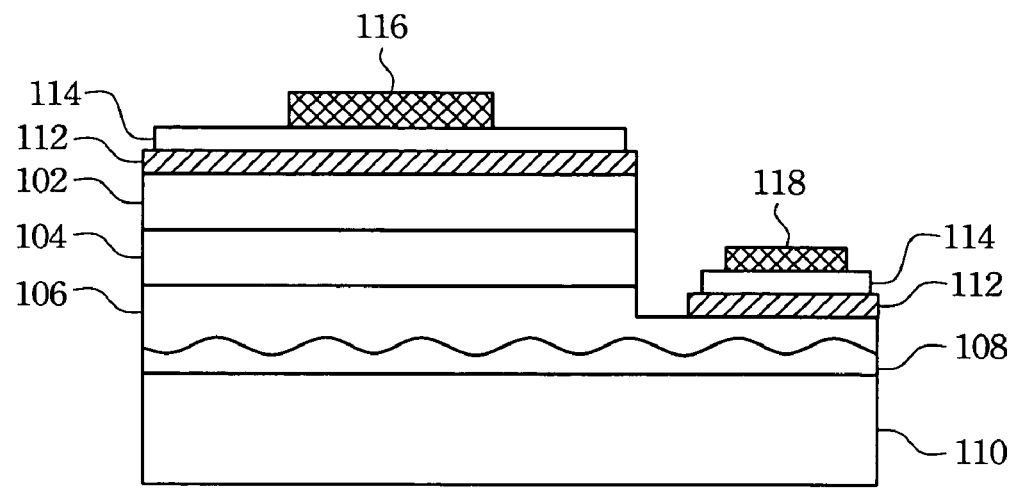

Next, referring to FIG. 1C, a mesa etching process is performed on the AlGaInP LED epitaxy, and a portion of the AlGaInP LED epitaxy is removed to a depth to form two top surfaces of the AlGaInP LED epitaxy on the transparent substrate material 110. One top surface exposes the n-type AlGaInP layer 102, and another top surface exposes the p-type AlGaInP layer 106. Then, a metal reflective layer 112 and a barrier layer 114 are formed in turn on the n-type AlGaInP layer 102 and the p-type AlGaInP layer 106. Finally, a cathode electrode 116 and an anode electrode 118 are fabricated on the barrier layer 114. The cathode electrode 116 and the anode electrode 118 are made from metal materials with good conductivity, such as Au or Al.

The metal reflective layer 112 is made from a metal material with high reflectivity for light; for example, Au, Al, Ag, or Ag alloy is used as the metal reflective layer 112, and the metal reflective layer 112 has a great capacity for reflecting the light emitted from the AlGaInP LED. Further, the barrier layer 114 is utilized to prevent the cathode electrode 116 and the anode electrode 118 from metal diffusing into the metal reflective layer 112 and maintain the reflectivity of the metal reflective layer 112. The preferable material of the barrier layer 114 is Ni, W, TiN, Pt, WN, ZnO, or ITO.

Figure 1D:
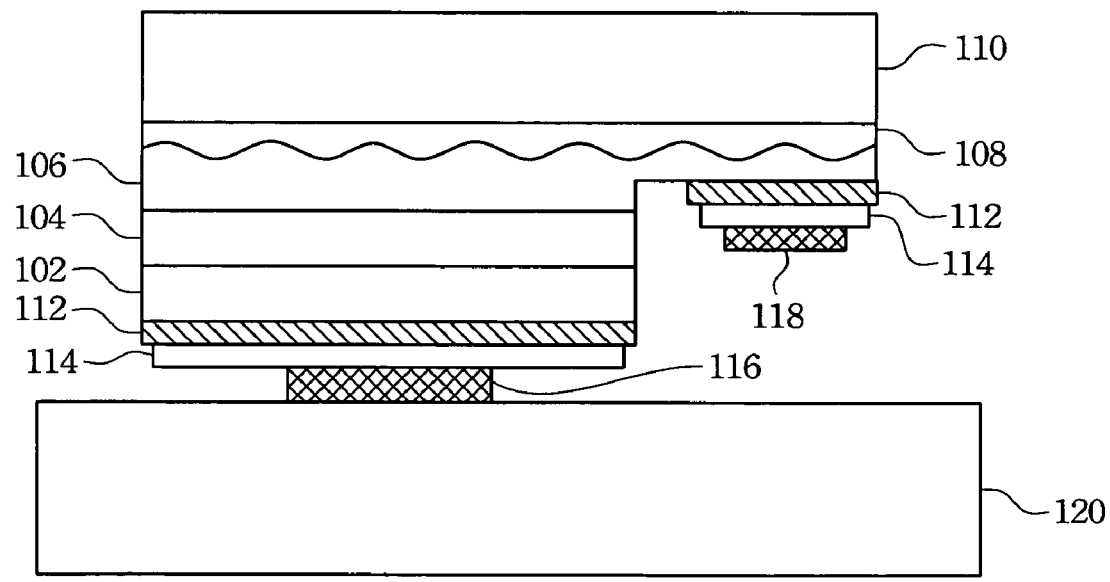

A complete AlGaInP LED device is finished through processes aforementioned, and the complete AlGaInP LED device can be reversed onto a solder 120 directly by flip chip packaging technology to become a flip chip AlGaInP LED device (as shown in FIG. 1D) for the following package process.

In FIG. 1D, because the transparent substrate material 110 is transparent, the light emitted from the AlGaInP LED is able to pass through the transparent substrate material 110 and output outwards successfully without being blocked or absorbed by the transparent substrate material 110, and the light output intensity of the LED device is improved effectively. Further, the present embodiment utilizes the metal reflective layer 112 to reflect the light emitted downward from the AlGaInP LED structure, and the light emitted downward is thus reflected back into the LED device and changed into a source of the light output upward. Therefore, the light emitted from the AlGaInP LED is utilized more effectively for enhancing the light output intensity greatly.

Moreover, since there's a large difference in refractive index between the semiconductor material of the AlGaInP LED and the transparent adhesive layer 108 generally, the refractive index of the transparent adhesive layer 108 is hard to suitably match that of the AlGaInP LED, and the light emitted upward from the AlGaInP LED is easily reflected back into the device without being outputted smoothly so the total reflection phenomenon occurs and lowers the light output efficiency. Therefore, the rough surface of the p-type AlGaInP layer 106 produced in the present embodiment is utilized to form a rough interface of the transparent adhesive layer 108 and the AlGaInP LED structure, and the light scattering or refraction thus occurs for reducing the total reflection phenomenon inside the device when the light emitted enters into the interface of the p-type AlGaInP layer 106 and the transparent adhesive layer 108. The light emitted from the AlGaInP LED passes through the transparent substrate material 110 more effectively by the rough surface of the p-type AlGaInP layer 106, and the light extraction efficiency of the LED device is improved.

Figure 2:
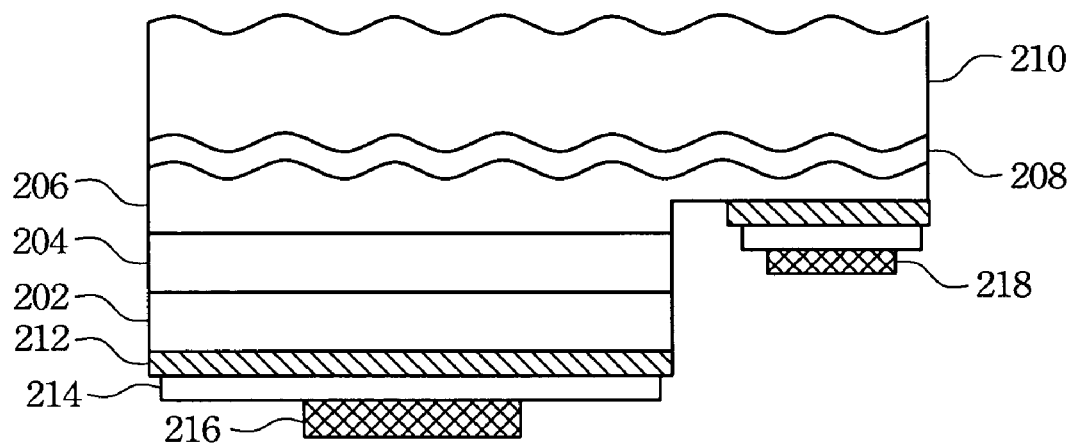
FIG. 2 is a cross-sectional, schematic diagram showing the structure of another AlGaInP LED in accordance with the preferred embodiment of the present invention.

In addition to the processes aforementioned, the transparent substrate material is surface-roughened by micro-etching to form another rough surface for increasing the light extraction efficiency; referring to FIG. 2 showing the structure of another AlGaInP LED in accordance with the preferred embodiment of the present invention.

In FIG. 2, a p-type AlGaInP layer 206, an active layer 204, a n-type AlGaInP layer 202, a metal reflective layer 212, a barrier layer 214, a cathode electrode 216, and an anode electrode 218 are fabricated in the same processes aforementioned; besides, not only the p-type AlGaInP layer 206 is surface-roughened to form a rough interface of the AlGaInP LED structure and a soft transparent adhesive layer 208, but also the top surface and the undersurface of a transparent substrate material 210 are roughened to form another rough interface of the soft transparent adhesive layer 208 and the transparent substrate material 210, and the exposed top surface of the transparent substrate material 210 is rough simultaneously.

Surface-roughening the transparent substrate material 210 may be performed by micro etching, and the surface of the transparent substrate material 210 is micro-etched before coating the soft transparent adhesive layer 208 on the transparent substrate material 210 or after bonding the transparent substrate material 210 to the AlGaInP LED structure.

According to the aforementioned preferred embodiment of the present invention, the substrate is changed into the transparent substrate material for enabling a large amount of the light emitted from the AlGaInP LED to pass through and be successfully output outwards. The light output intensity of the AlGaInP LED device is thus improved.

Furthermore, the metal reflective layer and the barrier layer are combined in the present invention to make good use of the light emitted downward from the LED for greatly improving the light output intensity, and the device brightness is increased.

Moreover, the surface of the AlGaInP LED structure or that of the transparent substrate material is further roughened in the present invention to increase the light extraction of the AlGaInP LED device, and the light output intensity of the AlGaInP LED device is further improved.

While the present invention has been disclosed with reference to the preferred embodiments of the present invention, it should not be considered limited thereby. Various possible modifications and alterations by one skilled in the art can be included within the spirit and scope of the present invention; the scope of the invention is determined by the claims that follow.

What is claimed is:

1. A method of fabricating an AlGaInP light-emitting diode, comprising the steps of:
    forming at least an AlGaInP light-emitting diode epitaxy on a substrate;
    utilizing a soft transparent adhesive layer to bond a transparent substrate material onto the AlGaInP light-emitting diode epitaxy, wherein the soft transparent adhesive layer is between the transparent substrate material and the AlGaInP light-emitting diode epitaxy;
    removing the substrate to expose entirely the AlGaInP light-emitting diode epitaxy;
    etching the AlGaInP light-emitting diode epitaxy to remove a portion of the AlGaInP light-emitting diode epitaxy to a depth so the AlGaInP light-emitting diode epitaxy has a first top surface and a second top surface, wherein the first top surface has a greater distance than the second top surface from the transparent substrate material, the first top surface has a first-type electricity, and the second top surface has a second-type electricity;
    forming a metal reflective layer on the first top surface and a portion of the second top surface of the AlGaInP light-emitting diode epitaxy; and
    fabricating a first electrode and a second electrode on the metal reflective layer, wherein the first electrode is above the first top surface of the AlGaInP light-emitting diode epitaxy, and the second electrode is above the second top surface of the AlGaInP light-emitting diode epitaxy.

2. The method of claim 1, wherein a method of forming the AlGaInP light-emitting diode epitaxy comprises the steps of:
    forming a first-type AlGaInP layer on the substrate;
    forming an active layer on the first-type AlGaInP layer; and
    forming a second-type AlGaInP layer on the active layer.

3. The method of claim 1, wherein the substrate is GaAs.

4. The method of claim 1, wherein the soft transparent adhesive layer is made from bisbenzocyclobutene (BCB) resin.

5. The method of claim 1, wherein the transparent substrate material is sapphire, glass, GaP, or SiC.

6. The method of claim 1, wherein the metal reflective layer is made from Au, Al, Ag, or Ag alloy.

7. The method of claim 1, wherein between the step of forming the AlGaInP light-emitting diode epitaxy and the step of utilizing the soft transparent adhesive layer to bond the transparent substrate material further comprises roughening a surface of the AlGaInP light-emitting diode epitaxy to form a rough surface.

8. The method of claim 7, wherein the surface of AlGaInP light-emitting diode epitaxy is roughened by micro etching.

9. The method of claim 7, wherein the rough surface of the AlGaInP light-emitting diode epitaxy is composed of bar-shaped, triangular, or round salient figures.

10. The method of claim 1, wherein between the step of forming the metal reflective layer and the step of fabricating the first electrode and the second electrode further comprises forming a barrier layer, wherein a portion of the barrier layer is interlaid between the metal reflective layer and the first electrode, and another portion of the barrier layer is between the metal reflective layer and the second electrode.

11. The method of claim 10, wherein the barrier layer is made from Ni, W, tungsten nitride (WN), titanium nitride (TiN), platinum (Pt), zinc oxide (ZnO), or indium tin oxide (ITO).

12. The method of claim 1, further comprising a step of surface-roughening the transparent substrate material to form another rough surface.

13. A method of fabricating an AlGaInP light-emitting diode, comprising the steps of:
    forming at least an AlGaInP light-emitting diode epitaxy on a substrate;
    roughening the AlGaInP light-emitting diode epitaxy to form a rough surface;
    utilizing a soft transparent adhesive layer to bond a transparent substrate material onto the AlGaInP light-emitting diode epitaxy, wherein the soft transparent adhesive layer is between the transparent substrate material and the AlGaInP light-emitting diode epitaxy;
    removing the substrate to expose entirely the AlGaInP light-emitting diode epitaxy;
    etching the AlGaInP light-emitting diode epitaxy to remove a portion of the AlGaInP light-emitting diode epitaxy to a depth so the AlGaInP light-emitting diode epitaxy has a first top surface and a second top surface, wherein the first top surface has a greater distance than the second top surface from the transparent substrate material, and the first top surface and the second top surface have a first-type electricity and a second-type electricity, respectively;

forming a metal reflective layer on the first top surface and a portion of the second top surface of the AlGaInP light-emitting diode epitaxy;

forming a barrier layer on the metal reflective layer; and fabricating a first electrode and a second electrode on the metal reflective layer, wherein the first electrode is above the first top surface of the AlGaInP light-emitting diode epitaxy, and the second electrode is above the second top surface of the AlGaInP light-emitting diode epitaxy.

* * * * *